(12) United States Patent
Peng et al.

(10) Patent No.: US 9,203,408 B1
(45) Date of Patent: Dec. 1, 2015

(54) RECONFIGURABLE LOGIC ANALYZER CIRCUITRY

(71) Applicant: Altera Corporation, San Jose, CA (US)

(72) Inventors: Yi Peng, Newark, CA (US); Kenton Orthner, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/245,291

(22) Filed: Apr. 4, 2014

(51) Int. Cl.
*H03K 19/173* (2006.01)
*H03K 19/177* (2006.01)
*H03K 19/003* (2006.01)

(52) U.S. Cl.
CPC .......... *H03K 19/003* (2013.01); *H03K 19/1776* (2013.01); *H03K 19/17756* (2013.01)

(58) Field of Classification Search
CPC . G06F 17/5027; G06F 11/25; G06F 11/2294; G06F 11/27; H03K 19/17756; H03K 19/1776; H03K 19/17764
See application file for complete search history.

(56) References Cited

U.S. PATENT DOCUMENTS

| | | | |
|---|---|---|---|
| 5,983,277 A | 11/1999 | Heile et al. | |
| 6,107,821 A | 8/2000 | Kelem et al. | |
| 8,362,798 B2 | 1/2013 | Fulks, III | |
| 8,381,068 B1 | 2/2013 | Pedersen | |
| 8,415,974 B1 * | 4/2013 | Lysaght | 326/39 |
| 8,516,304 B2 * | 8/2013 | Bailey et al. | 714/30 |
| 8,533,655 B1 * | 9/2013 | Konduru | 716/136 |
| 2013/0162290 A1 | 6/2013 | Margabandu et al. | |

* cited by examiner

*Primary Examiner* — Jany Richardson
(74) *Attorney, Agent, or Firm* — Treyz Law Group, P.C.; Michael H. Lyons

(57) ABSTRACT

Integrated circuits may include embedded logic analyzer circuitry that monitors and stores data received from logic circuitry. The logic analyzer circuitry may include storage circuitry and logic analyzer control circuitry that controls the storage circuitry. The control circuitry may include trigger condition circuitry that compares the data to a trigger condition. When the data satisfies the trigger condition, the storage circuitry may stop storing the data and stored data may be conveyed to fault detection circuitry for debugging the design of the logic circuitry. The integrated circuit may include programmable memory elements that can be loaded with configuration data. The logic analyzer circuitry may include partial-reconfiguration control circuitry that reconfigures the control circuitry without reconfiguring other portions of the integrated circuit. The partial-reconfiguration control circuitry may, for example, update the trigger condition by reconfiguring the control circuitry while the rest of the integrated circuit continues to operate normally.

24 Claims, 8 Drawing Sheets

RECONFIGURABLE LOGIC ANALYZER CIRCUITRY

BACKGROUND

This relates to integrated circuits and more particularly, to reconfigurable logic analyzer circuitry on integrated circuits such as programmable integrated circuits.

Programmable integrated circuits are a type of integrated circuit that can be programmed by a user to implement a desired custom logic function. In a typical scenario, a logic designer uses computer-aided design tools to design a custom logic circuit. When the design process is complete, the computer-aided design tools generate configuration data. The configuration data is loaded into memory elements to configure the devices to perform the functions of the custom logic circuit.

Memory elements are often formed using random-access-memory (RAM) cells. Because the RAM cells are loaded with configuration data during device programming, the RAM cells are sometimes referred to as configuration memory or configuration random-access-memory cells (CRAM).

During normal operation of a programmable device, loaded CRAM cells produce static output signals that are applied to the gates of transistors (e.g., pass transistors). The CRAM output signals turn some transistors on and turn other transistors off. This selective activation of certain transistors on the programmable device customizes the operation of the programmable device so that the programmable device performs its intended function.

Configuration data may be supplied to a programmable device in the form of a configuration bit stream. After a first configuration bit stream has been loaded onto a programmable device, the programmable device may be reconfigured by loading a different configuration bit stream in a process known as reconfiguration. An entire set of configuration data is often loaded during reconfiguration. However, it may sometimes be advantageous to reconfigure only a portion of the configuration bits using a process known as partial reconfiguration.

SUMMARY

An integrated circuit that includes memory elements and partial reconfiguration circuitry operable to reconfigure a selected portion of the memory elements is provided. The integrated circuit may include embedded logic analyzer circuitry that monitors and temporarily stores signal waveform data received from one or more regions of logic circuitry on the integrated circuit.

The logic analyzer circuitry may receive incoming data from the logic circuitry at first and second tap points located on the logic circuitry. The logic analyzer circuitry may include storage circuitry that stores incoming data received from the logic circuitry. The logic analyzer circuitry may include logic analyzer control circuitry that controls the storage circuitry. For example, the logic analyzer control circuitry may include storage management circuitry and trigger condition circuitry. The trigger condition circuitry may compare the incoming data (e.g., a set of incoming data received over one of the tap points) to a trigger condition. When the trigger condition circuitry determines that the incoming data satisfies the trigger condition, the trigger condition circuitry may instruct the storage circuitry to stop storing the incoming data (e.g., by freezing a data input to the storage circuitry). The data stored at the storage circuitry may subsequently be conveyed to fault detection circuitry for debugging the design of the logic circuitry. If desired, the trigger condition circuitry may filter the data that is to be stored on the storage circuitry and/or compared to the trigger condition by comparing the incoming data to a filter condition.

The integrated circuit may include programmable memory elements that can be loaded with configuration data. After the integrated circuit is initially loaded with a first set of configuration data, the integrated circuit may be reconfigured by loading a different set of configuration data. Sometimes it may be desirable to reconfigure only a portion of the memory elements on the integrated circuit in a process sometimes referred to herein as partial reconfiguration. The logic analyzer circuitry may include partial-reconfiguration control circuitry that performs partial-reconfiguration operations on the logic analyzer control circuitry. For example, the partial-reconfiguration circuitry may reconfigure the logic analyzer control circuitry using a configuration bit stream (configuration data) without reconfiguring other portions of the integrated circuit or logic analyzer circuitry (e.g., without reconfiguring the regions of logic circuitry, the storage circuitry, etc.). The partial-reconfiguration circuitry may reconfigure the logic analyzer control circuitry to adjust the trigger condition, the filter condition, and/or the location of the tap points on the regions of logic circuitry using the configuration bit stream.

Prior to performing partial reconfiguration operations, the storage circuitry may stop storing incoming data while the rest of the integrated circuit continues to operate normally (e.g., while the rest of the integrated circuit continues to operate without rebooting or resetting). After the partial-reconfiguration control circuitry reconfigures the logic analyzer control circuitry, the logic analyzer control circuitry may restart the data input to the storage circuitry without restarting other portions of the integrated circuit (e.g., by releasing the data input so that the storage circuitry resumes receiving and storing the incoming data). The partial-reconfiguration control circuitry may reconfigure the logic analyzer control circuitry without interrupting operations for other portions of the integrated circuit.

Further features of the present invention, its nature and various advantages will be more apparent from the accompanying drawings and the following detailed description.

DETAILED DESCRIPTION

Embodiments of the present invention relate to integrated circuits with an embedded logic analyzer. The integrated circuits may be any suitable type of integrated circuit, such as microprocessors, application-specific integrated circuits, digital signal processors, memory circuits, or other integrated circuits. If desired, the integrated circuits may be programmable integrated circuits that contain programmable logic circuitry. The present invention will generally be described in the context of integrated circuits such as programmable logic device (PLD) integrated circuits as an example.

Figure 1:
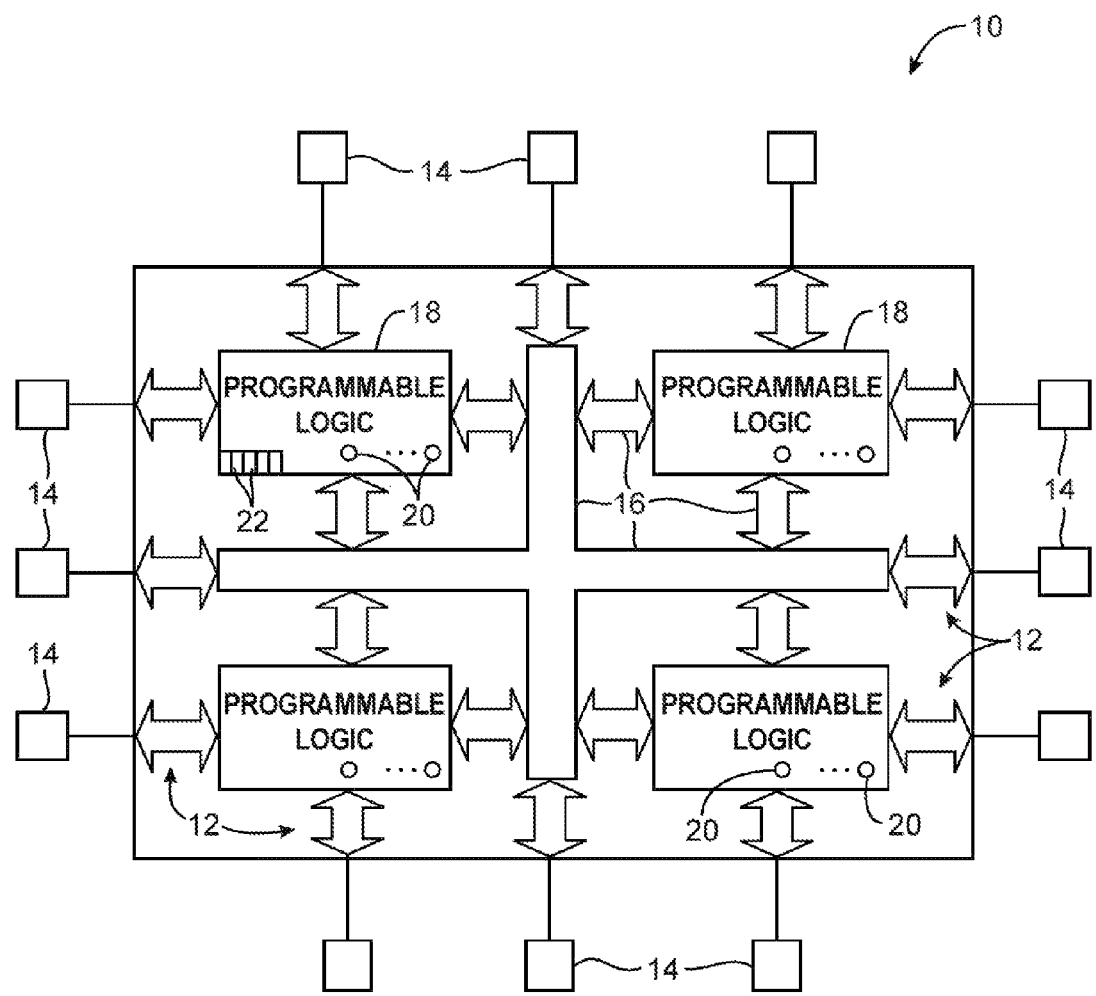
FIG. 1 is a diagram of an illustrative programmable integrated circuit in accordance with an embodiment of the present invention.

FIG. 1 is a diagram of an illustrative integrated circuit such as a programmable integrated circuit 10. Programmable device 10 may include input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include conductive lines and programmable connections between respective conductive lines and are therefore sometimes referred to as programmable interconnects 16.

Programmable device 10 may include programmable logic 18 that can be configured to perform a custom logic function. Programmable logic 18 may include combinational and sequential logic circuitry. The programmable interconnects 16 may be considered to be a type of programmable logic 18.

Device 10 may also contain programmable memory elements 20. Memory elements 20 can be loaded with configuration data (also called programming data) using pins 14 and input-output circuitry 12. Once loaded, the memory elements may each provide a corresponding static control signal that controls the operation of an associated logic component in programmable logic 18. In a typical scenario, the outputs of the loaded memory elements 20 are applied to the gates of metal-oxide-semiconductor transistors in programmable logic 18 to turn certain transistors on or off and thereby configure the logic in programmable logic 18 and routing paths. Programmable logic circuit elements that may be controlled in this way include pass transistors, parts of multiplexers (e.g., multiplexers used for forming routing paths in programmable interconnects 16), look-up tables, logic arrays, various logic gates, etc.

Memory elements 20 may be implemented using any suitable volatile and/or non-volatile memory structures such as random-access-memory (RAM) cells, fuses, antifuses, programmable read-only-memory memory cells, mask-programmed and laser-programmed structures, combinations of these structures, etc. Because memory elements 20 are loaded with configuration data during programming, memory elements 20 are sometimes referred to as configuration memory, configuration RAM (CRAM), or programmable memory elements.

The circuitry of device 10 may be organized using any suitable architecture. As an example, the logic of device 10 may be organized in a series of rows and columns of larger programmable logic regions each of which contains multiple smaller logic regions. The smaller regions may be, for example, regions of logic that are sometimes referred to as logic elements (LEs), each containing a look-up table (LUT), one or more registers, and programmable multiplexer circuitry. The smaller regions may also be, for example, regions of logic that are sometimes referred to as adaptive logic modules (ALMs). Each adaptive logic module may include a pair of adders, a pair of associated registers and a look-up table or other block of shared combinational logic (as an example). The larger regions may be, for example, logic array blocks (LABs) containing multiple logic elements or multiple ALMs. In the example of FIG. 1, illustrative logic regions 22 (which may be, for example, LEs or ALMs) are shown in one of the larger regions of programmable logic 18 in FIG. 1 (which may be, for example, a logic array block). In a typical programmable logic device 10, there may be hundreds or thousands of smaller logic regions 22. The logic regions 22 that are shown in FIG. 1 are merely illustrative.

During device programming, configuration data is loaded into device 10 that configures the programmable logic regions 22 and programmable logic regions 18 so that their logic resources perform desired logic functions on their inputs and produce desired output signals. For example, CRAM cells are loaded with appropriate configuration data bits (sometimes referred to herein as a bit stream) to configure adders and other circuits on device 10 to implement desired custom logic designs.

The resources of device 10 such as programmable logic 18 may be interconnected by programmable interconnects 16. Interconnects 16 generally include vertical and horizontal conductors. These conductors may include global conductive lines that span substantially all of device 10, fractional lines such as half-lines or quarter lines that span part of device 10, staggered lines of a particular length (e.g., sufficient to interconnect several logic array blocks or other such logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 1, the device 10 generally also includes some programmable logic associated with the programmable interconnects, memory, and input-output circuitry on device 10. For example, input-output circuitry 12 may contain programmable input and output buffers. Interconnects 16 may be programmed to route signals to a desired destination.

Figure 2:
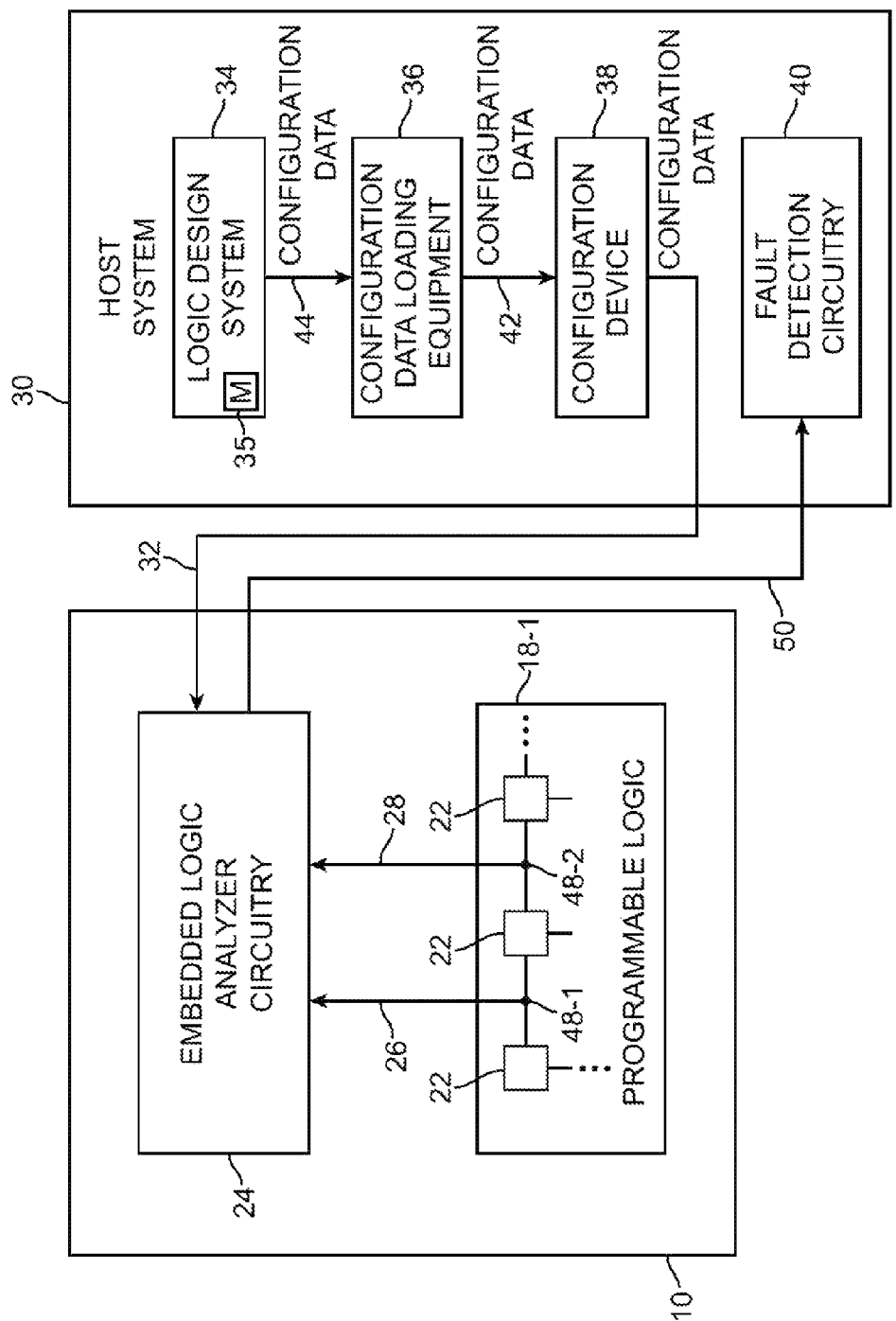
FIG. 2 is a diagram showing how configuration data is created by a logic design system and loaded into a programmable device having embedded logic analyzer circuitry for debugging the programmable device in accordance with an embodiment of the present invention.

An illustrative system environment for device 10 is shown in FIG. 2. Device 10 may be coupled to host system 30. Host system 30 may include logic design equipment such as logic design system 34, may include configuration data loading equipment such as loading equipment 36, may include configuration devices such as configuration device 38, and may include fault detection circuitry such as fault detection circuitry 40.

In general, programmable logic device 10 may receive configuration data from programming equipment or from other suitable equipment or device. In the example of FIG. 2, programmable logic device 10 is the type of programmable logic device that receives configuration data from an associated configuration device 38. If desired, configuration device 38 may include one or more integrated circuits. Configuration device 38 may, for example, be an erasable-programmable read-only memory (EPROM) chip, a programmable logic device configuration data loading chip with built-in memory, or other suitable device. When device 10 boots up (or at another suitable time), the configuration data for configuring programmable logic device 10 may be supplied to the programmable logic device from configuration device 38, as shown schematically by path 32. The configuration data that is supplied to the programmable logic device may be stored in the programmable logic device in its configuration random-access-memory elements 20 (FIG. 1).

Configuration device 38 may be supplied with the configuration data for device 10 over a path such as path 42. Configuration device 38 may, for example, receive the configuration data from configuration data loading equipment 36 or other suitable equipment that stores this data in configuration device 38.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 34 may be provided to equipment 36 over a path such as path 44. The equipment 36 provides the configuration data to device 38, so that device 38 can later provide this configuration data to the programmable logic device 10 over path 32. System 34 may be based on one or more computers and one or more software programs. In general, software and data may be stored on any computer-readable medium (storage) in system 34 and is shown schematically as storage 35.

In a typical scenario, logic design system 34 is used by a logic designer to create a custom circuit design. The system 34 produces corresponding configuration data which is provided to configuration device 38. Upon power-up, configuration device 40 and data loading circuitry on programmable logic device 10 is used to load an initial set of configuration data into CRAM cells 20 of device 10.

In order to ensure that logic designed at logic design system 34 is functioning properly when implemented on device 10, it may be desirable for a logic designer to debug the logic functions that are implemented on device 10 (e.g., to debug the custom circuit design corresponding to the configuration data loaded onto device 10). Programmable device 10 may include debugging circuitry such as embedded logic analyzer circuitry 24 for analyzing the design of one or more programmable logic regions on device 10. Embedded logic analyzer circuitry 24 may, for example, be implemented using programmable logic on device 10, may be implemented as a part of input-output circuitry 12, or may be located at any other desired location on device 10.

Embedded logic analyzer circuitry 24 may be used to gather data from the programmable logic on device 10 for analysis (e.g., data with which to perform debugging operations on device 10). For example, embedded logic analyzer circuitry 24 may capture signal waveforms (e.g., sequences of signal change over time) generated by regions of programmable logic 18 while device 10 is operating normally. One or more inputs (sometimes referred to herein as tap points) of embedded logic analyzer circuitry 24 may receive signal waveforms at one or more locations on logic 18.

In the example of FIG. 2, a first input of embedded logic analyzer circuitry 24 is coupled to programmable logic 18-1 via path 26, whereas a second input of embedded logic analyzer circuitry 24 is coupled to logic 18-1 via path 28. Logic analyzer circuitry 24 may receive signal waveform data generated by programmable logic 18-1 at tap points 48 (e.g., path 26 may be coupled to a first tap point 48-1 between a first pair of logic regions 22 and path 28 may be coupled to a second tap point 48-2 between a second pair of logic regions 22). Embedded logic analyzer circuitry 24 may serve to temporarily store and/or monitor the signal waveform data generated by logic 18-1 at tap points 48.

Due to the limited storage capacity of device 10 and embedded logic circuitry 24, only selected portions of the signal waveform data received from logic 18-1 may be stored at embedded logic analyzer circuitry 24 within any given time period. If desired, signal waveform data may be continuously stored in logic analyzer circuitry 24 and may be overwritten once storage on logic analyzer circuitry 24 is full.

In one suitable arrangement, embedded logic analyzer circuitry 24 may impose a trigger condition on the received signal waveform data that identifies when to capture a snap-shot of the signal waveform data received from logic 18-1. The snap-shot of signal waveform data may, for example, be the signal waveform data that is stored on logic analyzer circuitry 24 when the trigger condition is met (e.g., the snap-shot of signal waveform data may represent the recent past of the signal waveform data immediately before the trigger condition is satisfied). When the received signal waveform data satisfies the trigger condition, embedded logic analyzer 24 may capture a snap-shot of the incoming signal waveform data by stopping reception of data at input 26. Logic analyzer circuitry 24 may pass the signal waveform data that is stored at storage circuitry 66 when the trigger condition was met (e.g., the signal waveform data snap-shot) to fault detection circuitry 40 at host system 30 (as shown by path 50). Fault detection circuitry 40 may perform fault detection operations on the received data to debug the design of programmable logic 18-1. For example, fault detection circuitry 40 may analyze the snap-shot of signal waveform data to determine whether the signal waveform data matches desired signal waveform data for a given design of logic 18-1.

The example of FIG. 2 in which tap points 48 are placed between logic regions 22 is merely illustrative. If desired, tap points 48 may be chosen at any desired location on programmable logic 18-1 (e.g., between two or more ALMs, LEs, LABS, between two or more CRAM cells 20, etc.). If desired, paths 26 and 28 may be coupled to the same point on logic 18-1 (e.g., both inputs of logic analyzer circuitry 24 may be coupled to first tap point 48-1, both inputs of circuitry 24 may be coupled to second tap point 48-2, etc.). The location of tap points 48 may, if desired, be specified by configuration data received from configuration device 36.

Figure 3:
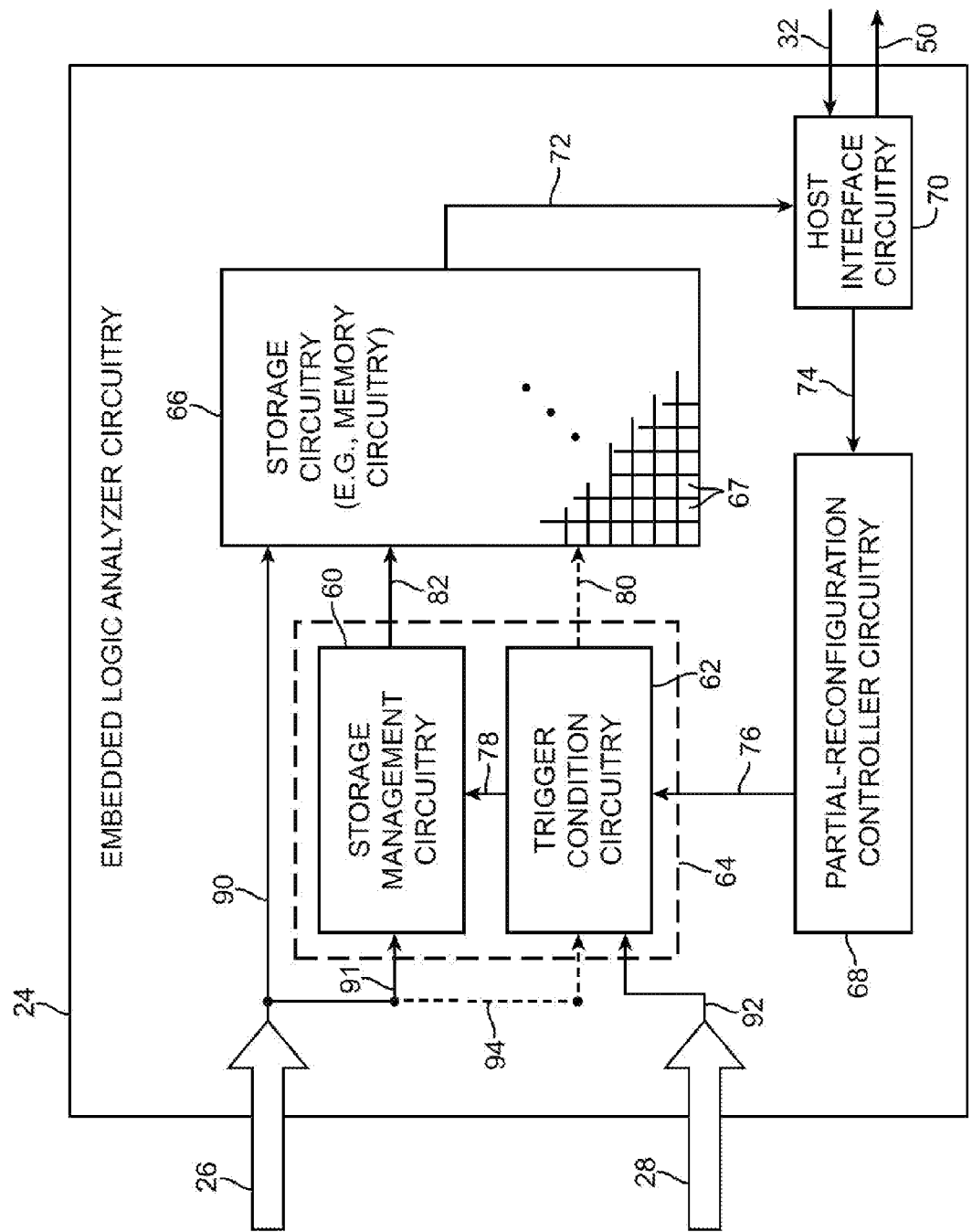
FIG. 3 is a diagram of illustrative logic analyzer circuitry having partial-reconfiguration controller circuitry for reconfiguring logic analyzer control circuitry in the logic analyzer circuitry in accordance with an embodiment of the present invention.

FIG. 3 is an illustrative diagram of logic analyzer circuitry such as embedded logic analyzer circuitry 24 formed on device 10 of FIG. 2. As shown in FIG. 3, embedded logic analyzer circuitry 24 may include storage management circuitry 60, trigger condition circuitry 62, partial-reconfiguration controller circuitry 68, host interface circuitry 70, and storage circuitry such as storage circuitry 66. Storage circuitry 66 may include memory elements 67. Memory elements 67 may be arranged in an array having rows and columns. Memory elements 67 may be implemented using any suitable volatile and/or non-volatile memory structures such as random-access-memory (RAM) cells, fuses, antifuses, programmable read-only-memory memory cells, mask-programmed and laser-programmed structures, combinations of these structures, etc. Each memory element 67 may be identified by an associated address.

Storage circuitry 66 may be coupled to first input 26 via path 90. Data received at first input 26 may be conveyed to storage circuitry 66 via path 90. Storage management circuitry 60 may receive data from logic 18-1 via path 91 (e.g., management circuitry 60 may receive data concurrently with storage circuitry 66). Storage management circuitry 60 may, for example, determine the address at which the received data should be stored within storage circuitry 66 (e.g., storage management circuitry 60 may identify and store address information associated with the data stored at storage circuitry 66).

If desired, data may be continuously stored on storage circuitry 66 in a circular fashion. For example, a first row of storage circuitry 66 may store incoming signal waveform data, a second row of storage circuitry 66 may store incoming signal waveform data after the first row is full, a third row of storage circuitry 66 may store incoming signal waveform data after the second row is full, etc. Once all of the rows of storage circuitry 66 are full, the first row of storage circuitry 66 may be overwritten with incoming signal waveform data. Any data that is read out of storage circuitry 66 for analysis and debugging (e.g., using fault detection circuitry 40 of FIG. 2) will thereby represent a snap-shot in time of the signal waveform received at input 26 (e.g., a snap-shot based on the data that is currently stored at memory 66). Embedded logic analyzer circuitry 24 may determine when to readout the snap-shot of signal waveform data received at input 26 by comparing data received at second input 28 to a trigger condition using trigger condition circuitry 62.

Trigger condition circuitry 62 may be coupled to second input 28 via path 92. Trigger condition circuitry 62 may be coupled to storage management circuitry 60 via path 78. Trigger condition circuitry 62 may be coupled to first input 26 via optional path 94 and may be coupled to storage circuitry 66 via optional path 80.

Trigger condition circuitry 62 may receive data from logic 18-1 over path 92. Trigger condition circuitry 62 may identify a trigger condition for embedded logic analyzer circuitry 24 that triggers readout of a snapshot of data from storage circuitry 66. For example, trigger condition circuitry 62 may receive a trigger input over path 92 that is to be compared to the trigger condition for embedded logic analyzer circuitry 24. The trigger condition may identify a condition for the incoming data at which to capture a snap-shot of the signal waveform data received over input 26. For example, embedded logic analyzer circuitry 24 may stop recording data from first input 26 to storage circuitry 66 when the trigger condition is satisfied. Trigger condition circuitry 62 may be implemented, for example, using comparators, logic functions, logic gates, or other control circuitry for determining whether incoming data satisfies the trigger condition. For example, trigger condition circuitry 62 may determine whether the data received from second input 28 satisfies the trigger condition. When trigger condition circuitry 62 determines that the received data satisfies the trigger condition, trigger condition circuitry 62 may instruct storage management circuitry 60 to stop recording data to storage circuitry 66. The signal waveform data that is stored at storage circuitry 66 (e.g., the snap-shot of signal waveform data) may then be passed to host interface circuitry 70. Host interface circuitry 70 may pass the data to fault detection circuitry 40 over path 50 for debugging.

In scenarios where trigger condition circuitry 62 receives signal waveform data from first input 26, as shown by optional path 94, trigger condition circuitry 62 may perform filtering operations on the signal waveform data so that only a portion of the incoming signal waveform data is actually stored on storage circuitry 66. The filtered signal waveform data may be passed to storage circuitry 66 as shown by path 80 without conveying signal waveform data to storage circuitry 66 over path 90.

If desired, trigger condition circuitry 62 may identify a filter condition for the incoming data. In this scenario, only incoming data having a certain characteristic that satisfies the filter condition is passed to storage circuitry 66 and/or compared to the trigger condition. As an example, trigger condition circuitry 62 may identify a filter condition that specifies that only every-other data bit received at input 26 is to be stored at storage circuitry 66. Trigger condition circuitry 62 may subsequently pass every-other data bit received from input 26 to storage circuitry 66 over path 80. As another example, trigger condition circuitry 62 may identify a filter condition that specifies that only every-other data bit received at second input 28 is to be compared to the trigger condition. Trigger condition circuitry 62 may subsequently compare every-other data bit received from input 28 to the trigger condition. In yet another example, the filter condition may be whenever the data signal received at input 28 is asserted high. In this example, trigger condition circuitry 62 may only pass data received from first input 26 to storage circuitry 66 while the data signal received from second input 28 is asserted high. Trigger condition circuitry 62 and storage management circuitry 60 may sometimes be referred to herein collectively as logic analyzer control circuitry 64.

The trigger condition implemented using trigger condition circuitry 62 may be any desirable condition for incoming data received at input 28. In one example, the trigger condition may be satisfied whenever there is a rising edge in the data received by trigger condition circuitry 62 from input 28. In this example, trigger condition circuitry 62 may instruct embedded logic analyzer 24 to freeze first input 26 when trigger condition circuitry 62 detects a rising edge in the data received from input 28. In another example, the trigger condition may be satisfied whenever the data received from input 28 has two consecutive bits with a logic value of "1." In this example, trigger condition circuitry 62 may compare the data received from input 28 to the trigger condition and may instruct embedded logic analyzer 24 to freeze first input 26 when trigger condition circuitry 62 receives two consecutive bits having a logic value of "1" over input 28.

During operation of device 10, it may be desirable to perform debugging operations on different portions of logic 18 or using a different trigger and/or filter condition. In order to change the trigger condition imposed by trigger condition circuitry 62, it may be necessary to reconfigure trigger device 10 using new configuration data. After device 10 is initially loaded with a first set of configuration data (e.g., using configuration device 38 as described above in connection with FIG. 2), device 10 may be reconfigured by loading a different set of configuration data. Sometimes it may be desirable to reconfigure only a portion of the memory cells on device 10 via a process sometimes referred to as partial reconfiguration. As memory cells are typically arranged in an array, partial reconfiguration can be performed by writing new data values only into a selected region in the array. In this way, portions of logic device 10 may be reconfigured using a different set of configuration data without rebooting or shutting down all of device 10.

In order to change the trigger condition imposed by trigger condition circuitry 62, configuration device 38 (FIG. 2) may reconfigure trigger condition circuitry 62 using additional configuration data. In some scenarios, it may be necessary to shut down or reboot all of device 10 in order to reconfigure trigger condition circuitry 62 (e.g., new configuration data for the entirety of device 10 may need to synthesized and loaded onto device 10 to reconfigure trigger condition circuitry 62). However, shutting down or rebooting all of device 10 disrupts other activities being performed by device 10 and can be time consuming.

In accordance with an embodiment, embedded logic analyzer circuitry 24 may perform reconfiguration only on logic analyzer control circuitry 64 (e.g., storage management circuitry and/or trigger condition circuitry 78) using an updated set of configuration data after device 10 has already been loaded with an initial set of configuration data. In this scenario, logic analyzer circuitry 64 may be reconfigured using the updated set of configuration data while the rest of device 10 operates normally (e.g., device 10 may be partially reconfigured so that new configuration data is loaded for logic analyzer control circuitry 64 without affecting other portions of device 10).

As shown in FIG. 3, embedded logic analyzer circuitry 24 may include partial-reconfiguration controller circuitry 68 (sometimes referred to herein as partial-reconfiguration control circuitry or partial-reconfiguration circuitry). Host interface circuitry 70 may receive configuration data from configuration device 38 over path 32. Host interface circuitry 70 may pass the configuration data to partial-reconfiguration controller circuitry 68 as shown by path 74. Partial-reconfiguration controller circuitry 68 may reconfigure some or all of logic analyzer control circuitry 64 using the received configuration data. Partial-reconfiguration controller circuitry 68 may perform partial-reconfiguration on device 10 by reconfiguring storage management circuitry 60 and/or trigger condition circuitry 62 using the configuration data without reconfiguring or rebooting other portions of device 10.

Partial-reconfiguration controller circuitry 68 may reconfigure logic analyzer circuitry 64 to perform a different trigger condition comparison operation, to select a different trigger condition, to perform filtering operations, to select a different filter condition, to adjust the location of tap points 48 (FIG. 2) within logic 18-1, or to perform any other desired function. Configured in this way, partial-reconfiguration controller circuitry 68 may adjust which portions of logic 18 are debugged and when debugging operations are performed in real time without affecting other portions of device 10. Configuration data that is provided to partial-reconfiguration controller 68 for reconfiguring logic analyzer circuitry 64 without affecting other portions of programmable logic device 10 may sometimes be referred to herein as partial reconfiguration data.

Figure 4:
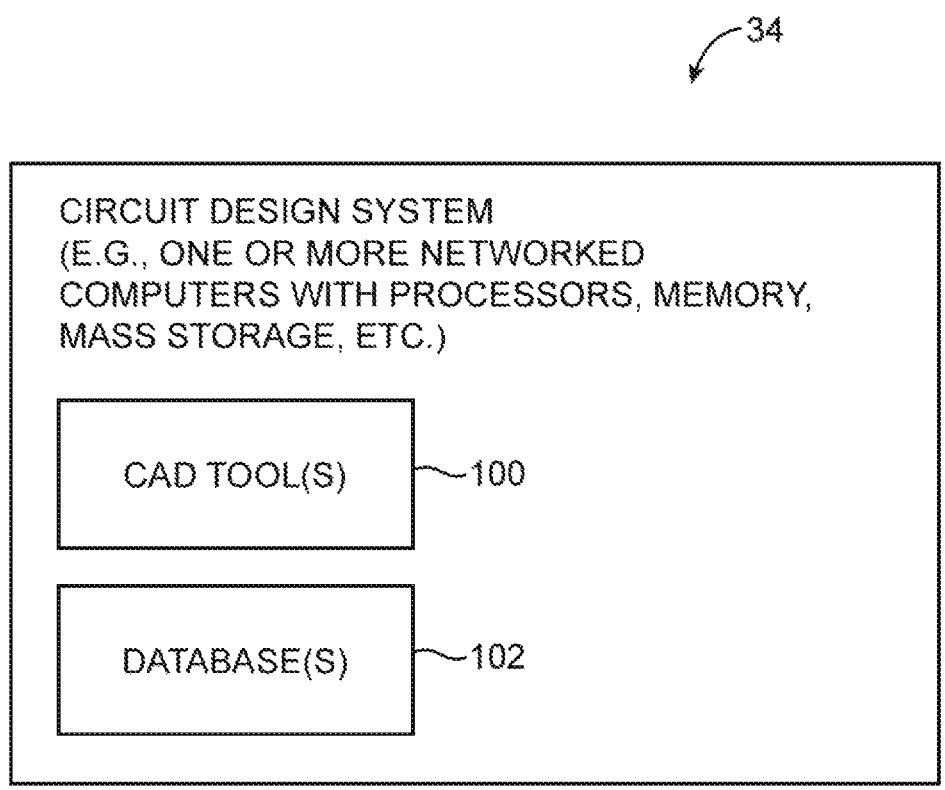
FIG. 4 is a diagram of a logic design system for generating configuration data for implementing custom circuit designs in programmable integrated circuits in accordance with an embodiment of the present invention.

Logic design system 34 in host system 30 (FIG. 2) may be used to generate partial reconfiguration data for partial reconfiguration controller circuitry 68. An illustrative logic design system 34 for generating partial reconfiguration data for controller circuitry 68 is shown in FIG. 4. As shown in FIG. 4, system 34 may be based on one or more processors such as personal computers, workstations, remote (e.g., online) processors such as cloud-based storage and processing circuitry, etc. The processor(s) may be linked using a network (e.g., a local or wide area network). Memory in these computers or external memory and storage devices such as internal and/or external hard disks may be used to store instructions and data.

Software-based components such as computer-aided design tools 100 and databases 102 reside on system 34. During operation, executable software such as the software of computer aided design tools 100 runs on the processor(s) of system 34. Databases 102 are used to store data for the operation of system 34. In general, software and data may be stored on any computer-readable medium (storage) in system 34. Such storage, which is shown schematically as storage 35 of FIG. 2, may include computer memory chips, removable and fixed media such as hard disk drives, flash memory, compact discs (CDs), DVDs, other optical media, and floppy diskettes, tapes, or any other suitable memory or storage device(s). When the software of system 34 is installed, the storage 35 of system 34 has instructions and data that cause the computing equipment in system 34 to execute various methods (processes). When performing these processes, the computing equipment is configured to implement the functions of the logic design system.

The computer aided design (CAD) tools 100, some or all of which are sometimes referred to collectively as a CAD tool, may be provided by a single vendor or multiple vendors. Tools 100 may be provided as one or more suites of tools (e.g., a compiler suite for performing tasks associated with implementing a circuit design in a programmable logic device) and/or as one or more separate software components (tools). Database(s) 102 may include one or more databases that are accessed only by a particular tool or tools and may include one or more shared databases. Shared databases may be accessed by multiple tools. For example, a first tool may store data for a second tool in a shared database. The second tool can access the shared database to retrieve the data stored by the first tool. This allows one tool to pass information to another tool. Tools may also pass information between each other without storing information in a shared database if desired.

Figure 5:
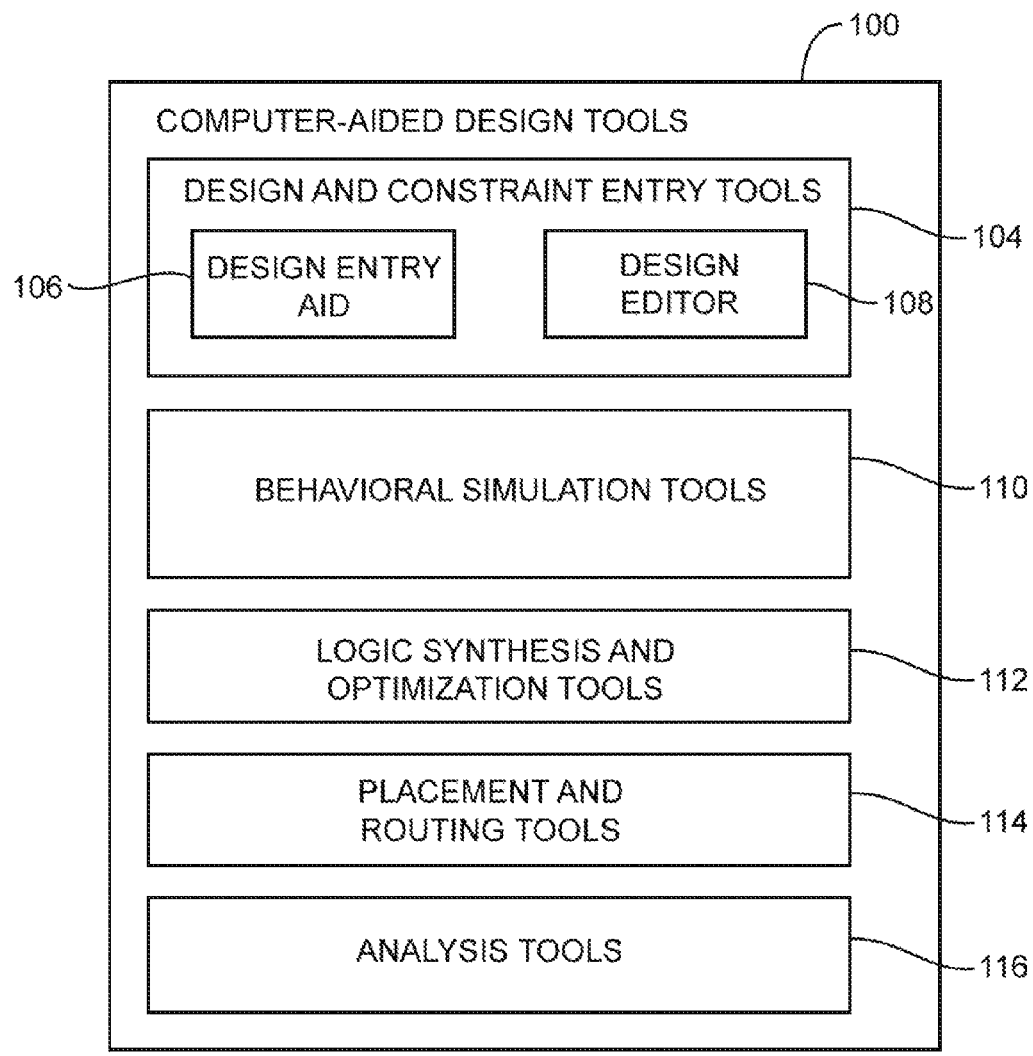
FIG. 5 is a diagram of illustrative computer-aided design (CAD) tools that may be used in a logic design system in accordance with an embodiment of the present invention.

Illustrative computer aided design tools 100 that may be used in a logic design system such as system 34 of FIGS. 2 and 4 are shown in FIG. 5.

The design process typically starts with the formulation of logic circuit functional specifications (e.g., a functional description of the logic circuit). A logic designer can specify how a desired circuit should function using design and constraint entry tools 104. For example, the logic designer can specify how logic analyzer control circuitry 64 should function. Design and constraint entry tools 104 may include tools such as design and constraint entry aid 106 and design editor 108. Design and constraint entry aids such as 106 may be used to help a logic designer locate a desired design from a library of existing logic designs and may provide computer-aided assistance to the logic designer for entering (specifying) the desired design.

As an example, design and constraint entry aid 106 may be used to present screens of options for a user. The user may click on on-screen options to select whether the circuit being designed should have certain features. Design editor 108 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 106 may be used to allow a logic designer to provide a desired logic design using any suitable format. For example, design and constraint entry tools 104 may include tools that allow the logic designer to enter a logic design using truth tables. Truth tables can be specified using text files or timing diagrams and may be imported from a library. Truth table logic design and constraint entry may be used for a portion of a large circuit or for an entire circuit.

As another example, design and constraint entry tools 104 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design and constraint entry tools 104 may allow the logic designer to provide a logic design to the logic design system 34 using a hardware description language such as Verilog hardware description language (HDL) or Very High Speed Integrated Circuit Hardware Description Language (VHDL). The designer of the logic circuit can enter the logic design by writing hardware description language code with editor 108. Blocks of code may be imported from user-maintained or commercial libraries if desired.

After the design has been entered using design and constraint entry tools 104, behavioral simulation tools 110 may be used to simulate the functional performance of the design. If the functional performance of the design is incomplete or incorrect, the logic designer can make changes to the design using design and constraint entry tools 104. The functional operation of the new design can be verified using behavioral simulation tools 110 before synthesis operations have been performed using tools 112. Simulation tools such as tools 110 may also be used at other stages in the design flow if desired (e.g., after logic synthesis). The output of the behavioral simulation tools 110 may be provided to the logic designer in any suitable format (e.g., truth tables, timing diagrams, etc.).

Once the functional operation of the logic design has been determined to be satisfactory, logic synthesis and optimization tools 112 may be used to implement the logic design in a particular programmable logic device (i.e., in the logic and interconnect resources of a particular programmable logic device product or product family).

Tools 112 attempt to optimize the design by making appropriate selections of hardware to implement different logic functions in the logic design based on the logic design data and constraint data entered by the logic designer using tools 104.

After logic synthesis and optimization using tools 112, the logic design system may use tools such as placement and routing tools 114 to perform physical design steps (layout synthesis operations). Placement and routing tools 114 are used to determine how to place the circuits for each logic function within the programmable logic device. For example, if two counters interact with each other, the placement and routing tools 114 may locate these counters in adjacent logic regions on the programmable logic device to reduce interconnect delays or to satisfy timing requirements specifying the maximum permitted interconnect delay. The placement and routing tools 114 create orderly and efficient implementations of logic designs for a given programmable logic device.

Tools such as tools 112 and 114 may be part of a compiler suite (e.g., part of a suite of compiler tools provided by a programmable logic device vendor). In accordance with the present invention, tools such as tools 112, 114, and 116 may automatically take into account the effects of crosstalk between interconnects while implementing a desired circuit design. Tools 112, 114, and 116 may also include timing analysis tools. This allows tools 112 and 114 to satisfy performance requirements (e.g., timing requirements) when generating configuration data (e.g., partial configuration data) for programming integrated circuits such as programmable integrated circuit 10.

After an implementation of the desired logic design in the programmable logic device has been generated using placement and routing tools 114, the implementation of the design may be analyzed and tested using analysis tools 116. After satisfactory optimization operations have been completed using tools 100, tools 100 can produce the configuration data for the programmable logic device.

Figure 6:
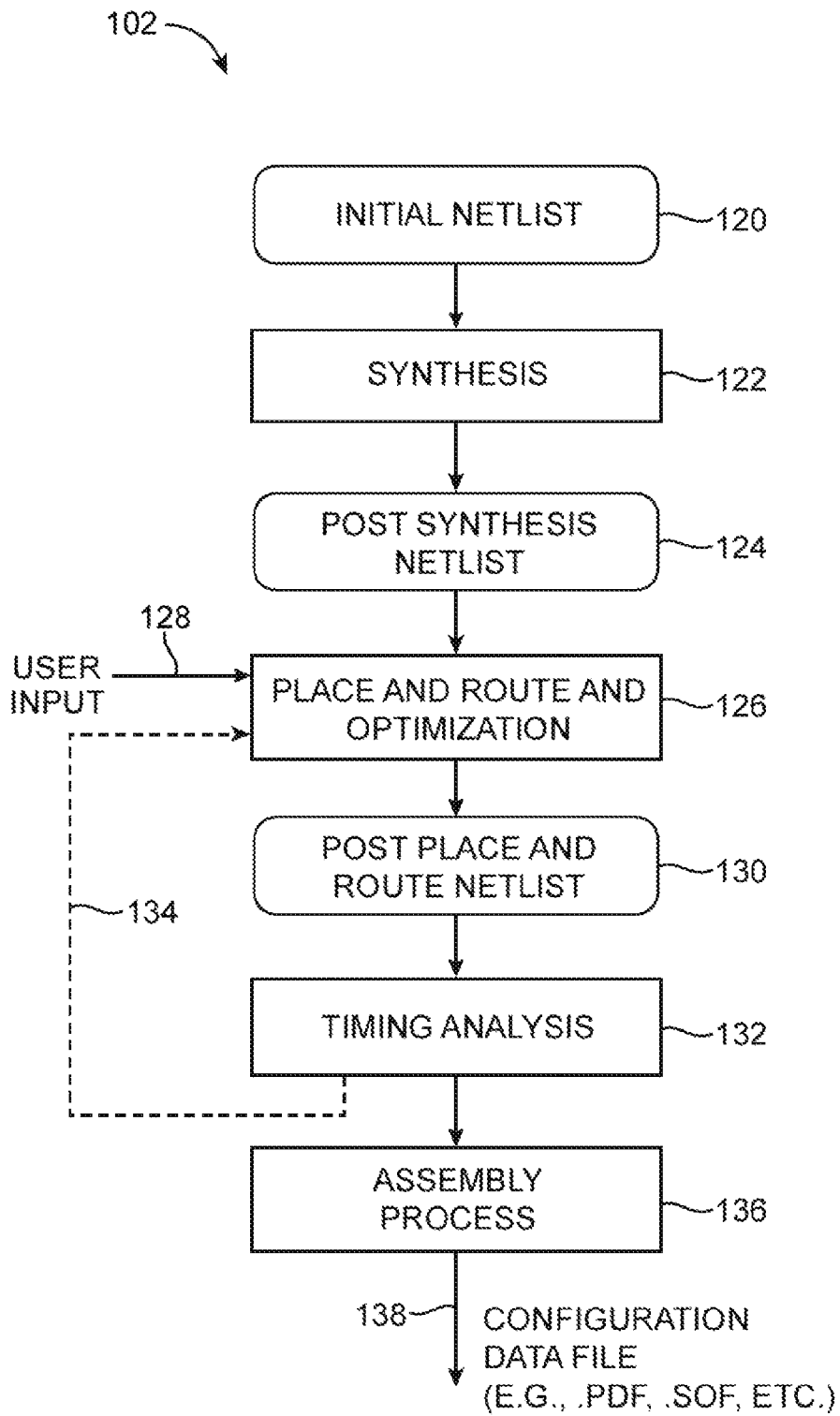
FIG. 6 is a flow chart of illustrative steps for designing a custom logic circuit and performing timing analysis in accordance with an embodiment of the present invention.

Illustrative operations involved in using tools 100 of FIG. 4 to produce configuration data files are shown in FIG. 6. As shown in FIG. 6, an initial netlist 120 is synthesized at step 122 to produce a post-synthesis netlist 124. At step 126, user input 128 and the post synthesis netlist 124 are processed during place and route and optimization operations. During the operations of step 126, the CAD tools 100 take account of the effects of using different positive power supply voltages and/or body bias voltages and, through appropriate selection of power supply and body bias levels, circuit resource assignments, and placement decisions, tools 100 reduce power consumption while satisfying design constraints.

The resulting netlist 130 may be processed further by performing a timing analysis using logic design system 34 (step 132). The timing analysis may be used to help ensure that the final netlist 130 satisfies timing constraints before configuring programmable integrated circuit 10. If desired, processing may optionally loop back to step 126 via path 134 to perform additional optimizations using the final netlist. For example, logic design system 34 may identify routing paths in the final netlist that fail timing constraints and determine replacement routing paths by returning to step 126 via optional path 134.

At step 136, the final netlist may be processed further during an assembly process to produce a configuration data file output (e.g., a .pof or .sof file). The configuration data file output may then be loaded onto programmable device 10. The configuration data file may, for example, include partial configuration data for reconfiguring logic analyzer circuitry 64 of FIG. 3 while operating the rest of device 10 normally.

Figure 7:
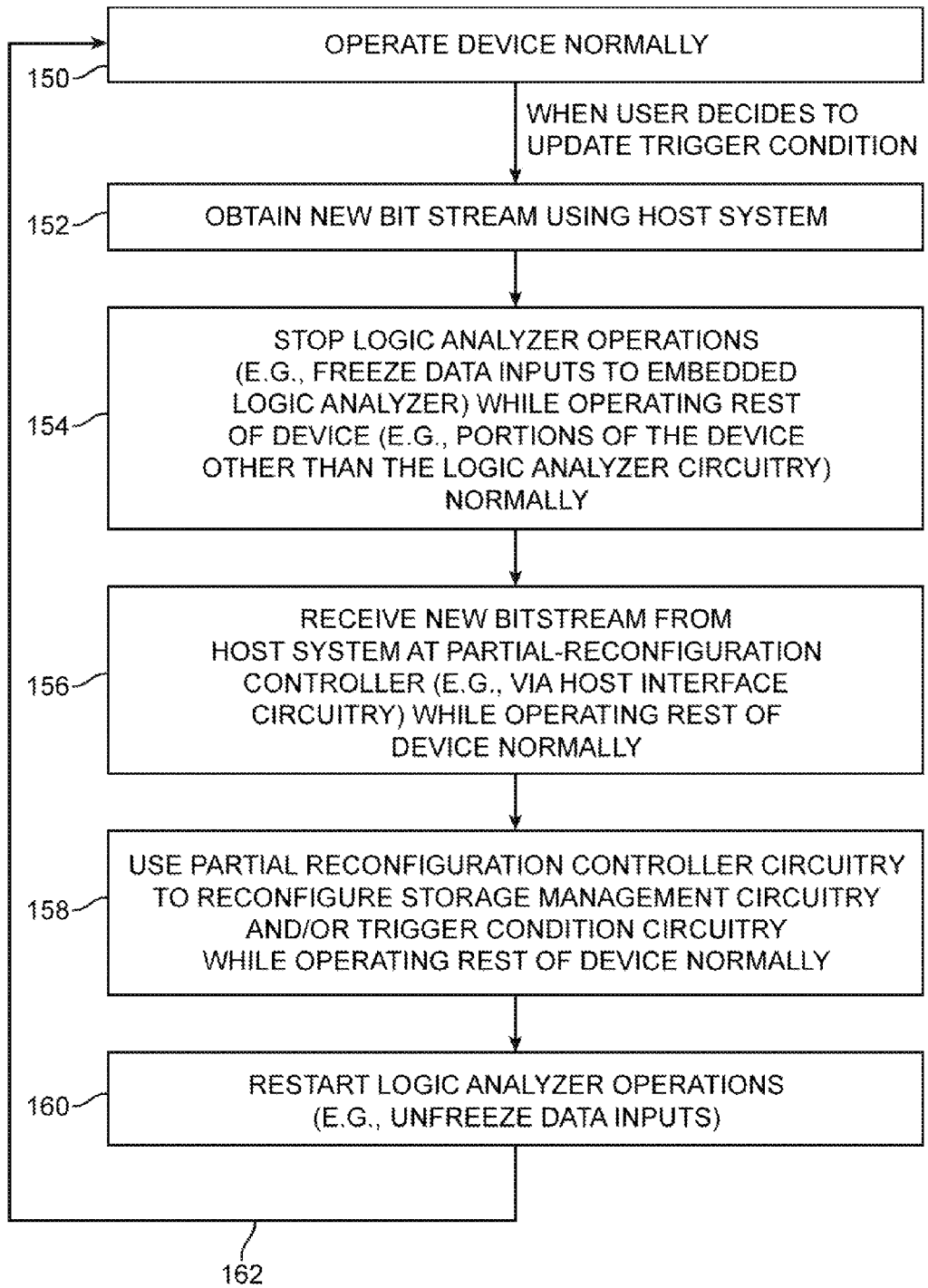
FIG. 7 is a flow chart of illustrative steps for reconfiguring logic analyzer circuitry on a programmable integrated circuit while the rest of the programmable integrated circuit continues to operate normally in accordance with an embodiment of the present invention.

FIG. 7 is a flow chart of illustrative steps that may be performed by embedded logic analyzer circuitry 24 (FIG. 3) and host system 30 for reconfiguring logic analyzer controller circuitry 64 while the rest of device 10 operates normally. The steps of FIG. 7 may, for example, allow logic control circuitry 64 to adjust the trigger conditions by which to debug programmable logic on device 10.

At step 150, all of device 10 may operate normally. For example, embedded logic analyzer circuitry 24 may receive signal waveform data at input 26 and may continuously record the received signal waveform data at storage circuitry 66. Embedded logic analyzer circuitry 24 may compare the signal waveform data to a trigger condition and may provide signal waveform data stored on storage circuitry 66 to fault detection circuitry 40 (FIG. 2) when the trigger condition is satisfied. Fault detection circuitry 40 and/or a user of fault detection circuitry 40 may debug the design of programmable logic device 10 based on the signal waveform data stored received from storage circuitry 66.

When host system 30 (e.g., a user of host system 30 such as a logic designer) decides to update the trigger condition implemented by trigger condition circuitry 62, host system 30 may generate a new bit stream (configuration data) using design system 34. The new bit stream may, for example, be generated while processing the steps of FIG. 6, and may include partial configuration data for reconfiguring logic analyzer control circuitry 64. The new bit stream may be passed to configuration device 38 for loading onto device 10.

At step 154, embedded logic analyzer circuitry 24 may stop logic analyzer operations while operating the rest of device 10 normally (e.g., host system 30 may provide control signals to embedded logic analyzer circuitry 24 instructing embedded logic analyzer circuitry to cease logic analyzer operations). For example, embedded logic analyzer circuitry 24 may freeze data inputs 26 and/or 28 so that no additional data is received by logic analyzer circuitry 24 while the rest of device 10 continues to operate normally.

At step 156, partial-reconfiguration controller circuitry 68 may receive the new bit stream (e.g., via host interface circuitry 70). Partial-reconfiguration controller circuitry 68 may receive the new bit stream while the rest of programmable logic device 10 continues to operate normally. This example is merely illustrative. If desired, partial-reconfiguration controller circuitry 68 may receive the new bit stream prior to freezing data inputs 26 and 28 (e.g., step 156 may be performed prior to step 154 if desired).

At step 158, partial-reconfiguration controller circuitry 68 may reconfigure logic analyzer control circuitry 64 (e.g., storage management circuitry 60 and/or trigger condition circuitry 62) using the new bit stream while the rest of programmable logic device 10 continues to operate normally. For example, partial-reconfiguration controller circuitry 68 may reconfigure logic analyzer control circuitry 64 to impose a new trigger condition and/or to change the location of tap points 48 based on the new bit stream.

At step 160, embedded logic analyzer circuitry 24 may restart normal logic analyzer operations while the rest of programmable logic device 10 continues to operate normally. For example, embedded logic analyzer circuitry 24 may unfreeze data inputs 26 and/or 28 and may resume recording data at storage circuitry 66. In this way, logic analyzer control circuitry 64 may reconfigure a portion of programmable logic device 10 (e.g., logic analyzer controller circuitry 64) without restarting the entirety of device 10 or disrupting other activities that are being performed by device 10. If desired, processing may loop back to step 150 as shown by path 162 to continue to operate device 10 and embedded logic analyzer circuitry 24 normally.

Figure 8:
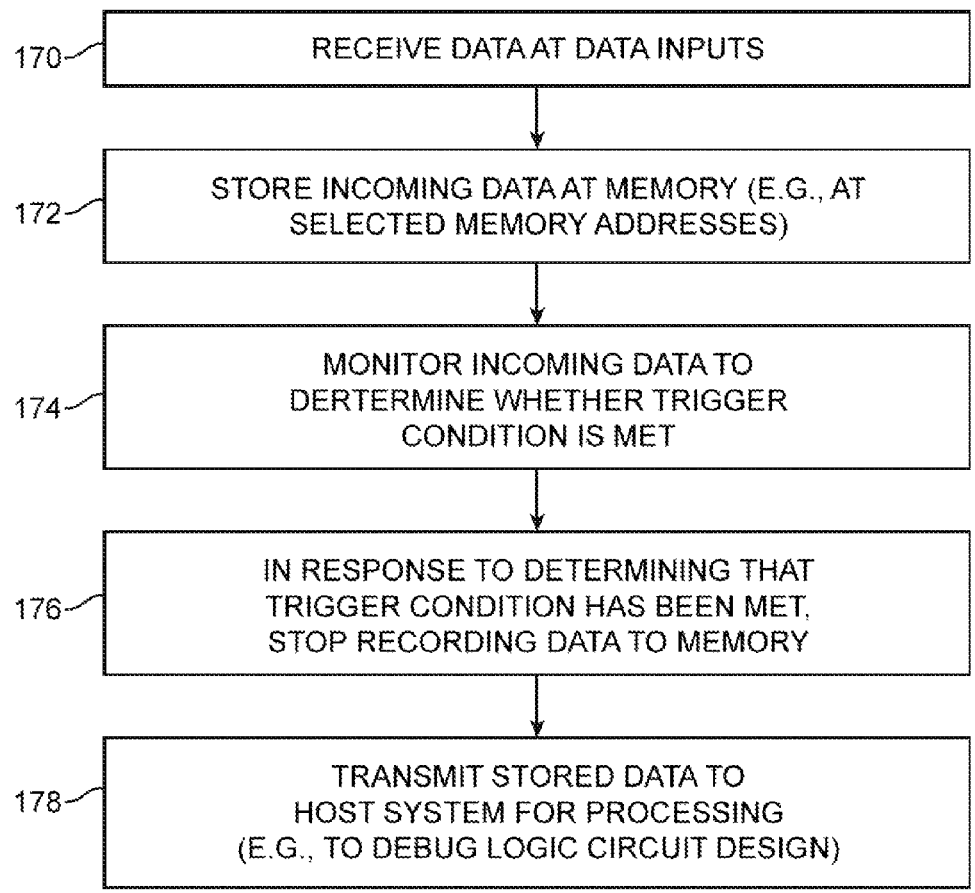
FIG. 8 is a flow chart of illustrative steps for analyzing data signals on a programmable integrated circuit using logic analyzer circuitry of the type shown in FIGS. 2 and 3 in accordance with an embodiment of the present invention.

FIG. 8 is a flow chart of illustrative steps for performing logic analyzer operations using logic analyzer circuitry. The steps of FIG. 8 may, for example, be performed by embedded logic analyzer circuitry 24 while processing step 150 of FIG. 7.

At step 170, embedded logic analyzer circuitry 24 may receive incoming signal waveform data at data inputs 26 and 28. For example, logic analyzer circuitry 24 may receive signal waveform data for storage over input 26 and may receive data identifying a trigger condition over input 28.

At step 172, embedded logic analyzer circuitry 24 may store the incoming data at memory 66. Storage management circuitry 60 direct embedded logic analyzer circuitry 24 to store the incoming data at selected memory addresses and may store information about which memory addresses are used to store the incoming data. If desired, trigger condition circuitry 62 may be used to filter the incoming signal waveform data (e.g., so that only a subset of the incoming data stored is stored in storage circuitry 66 and is compared to the trigger condition).

At step 174, trigger condition circuitry 62 may monitor the incoming signal waveform data to determine whether the incoming data satisfies the trigger condition. Trigger condition circuitry 62 and/or storage management circuitry 60 may implement logic functions (e.g., comparator logic, etc.) as specified by the initial configuration data loaded onto device 10 or as specified by partial reconfiguration data loaded by partial-reconfiguration controller circuitry 68. Trigger condition circuitry 62 may compare the (optionally filtered) incoming signal waveform data to the trigger condition. When trigger condition circuitry 62 determines that the trigger condition has been satisfied by the incoming data, trigger condition circuitry 62 may direct embedded logic analyzer circuitry 24 to stop recording data at memory 66 (step 176).

For example, trigger condition circuitry 62 may direct embedded logic analyzer circuitry 24 to freeze data input 26 so that no additional data is received by memory 66 and management circuitry 60.

At step 178, host interface circuitry 70 may read the signal waveform data stored at memory 66 (e.g., the snap-shot of signal waveform data stored at memory 66 when data input 26 was frozen) and may pass the signal waveform data to fault detection circuitry 50. The signal waveform data read from memory 66 may illustrate a snap-shot in time of the signal waveform data provided at input 26 immediately before the trigger condition was met. Fault detection circuitry 40 may use the signal waveform data snap-shot to debug and detect faults in the design of logic circuitry 18. In this way, embedded logic analyzer circuitry 24 may capture signal waveform data for from programmable logic device 10 for debugging the device using different trigger conditions (e.g., trigger conditions as corresponding to bit streams for reconfiguring logic analyzer control circuitry 64) without affecting the operation of other portions of device 10.

The foregoing is merely illustrative of the principles of this invention and various modifications can be made by those skilled in the art without departing from the scope and spirit of the invention. The foregoing embodiments may be implemented individually or in any combination.

What is claimed is:

1. Logic analyzer circuitry, comprising:
storage circuitry that stores incoming data;
logic analyzer control circuitry that controls the storage circuitry; and
partial-reconfiguration controller circuitry that reconfigures the logic analyzer control circuitry.

2. The logic analyzer circuitry defined in claim 1, further comprising:
host interface circuitry that receives a configuration bit stream from a logic design system, wherein the partial-reconfiguration controller circuitry receives the configuration bit stream from the host interface circuitry and reconfigures the logic analyzer control circuitry based on the configuration bit stream.

3. The logic analyzer circuitry defined in claim 2, wherein the storage circuitry receives the incoming data from a logic analyzer input, wherein the logic analyzer control circuitry comprises:
storage management circuitry coupled to the logic analyzer input and the storage circuitry.

4. The logic analyzer circuitry defined in claim 3, wherein the logic analyzer control circuitry further comprises:
trigger condition circuitry coupled to an additional logic analyzer input and the storage management circuitry, wherein the trigger condition circuitry receives additional incoming data from the additional logic analyzer input.

5. The logic analyzer circuitry defined in claim 4, wherein the trigger condition circuitry determines whether the additional incoming data satisfies a trigger condition and instructs the storage management circuitry to stop receiving the incoming data in response to determining that the additional incoming data satisfies the trigger condition.

6. The logic analyzer circuitry defined in claim 5, wherein the partial-reconfiguration controller circuitry adjusts the trigger condition by reconfiguring the trigger condition circuitry using the configuration bit stream.

7. The logic analyzer circuitry defined in claim 4, wherein the partial-reconfiguration controller circuitry reconfigures only the trigger condition circuitry and the storage management circuitry without reconfiguring other portions of the logic analyzer circuitry.

8. The logic analyzer circuitry defined in claim 7, wherein the logic analyzer circuitry is coupled to programmable logic circuitry through first and second tap points on the programmable logic circuitry, wherein the logic analyzer input receives the incoming data from the first tap point, and wherein the additional logic analyzer input receives the additional incoming data from the second tap point.

9. The logic analyzer circuitry defined in claim 8, wherein the partial-reconfiguration controller circuitry adjusts a location of the first tap point on the programmable logic circuitry based on the configuration bit stream.

10. The logic analyzer circuitry defined in claim 9, wherein the partial-reconfiguration controller circuitry adjusts a location of the second tap point on the programmable logic circuitry based on the configuration bit stream.

11. A method of operating an integrated circuit having logic analyzer control circuitry, logic circuitry, and partial-reconfiguration controller circuitry, the method comprising:
  with the partial-reconfiguration controller circuitry, receiving configuration data from a host system coupled to the integrated circuit; and
  with the partial-reconfiguration controller circuitry, reconfiguring the logic analyzer control circuitry based on the received configuration data without reconfiguring the logic circuitry.

12. The method defined in claim 11, wherein the integrated circuit comprises storage circuitry controlled by the logic analyzer control circuitry, the method further comprising:
  with the storage circuitry, storing incoming data received over a data input; and
  with the logic analyzer control circuitry, freezing the data input while the logic circuitry operates normally.

13. The method defined in claim 12, further comprising:
  with the logic analyzer control circuitry, restarting the data input after the logic analyzer control circuitry has been reconfigured by the partial-reconfiguration controller circuitry.

14. The method defined in claim 13, wherein restarting the data input comprises releasing the data input so that the storage circuitry resumes receiving the incoming data without restarting the logic circuitry.

15. The method defined in claim 12, further comprising:
  with the storage circuitry, storing signal waveform data received from the logic circuitry over the data input.

16. The method defined in claim 15, further comprising:
  with the logic analyzer control circuitry, determining whether the signal waveform data satisfies a trigger condition.

17. The method defined in claim 16, wherein determining whether the signal waveform data satisfies the trigger condition comprises:
  determining whether the signal waveform data satisfies a first trigger condition prior to reconfiguring the logic analyzer control circuitry using the partial-reconfiguration controller circuitry; and
  determining whether the signal waveform data satisfies a second trigger condition that is different from the first trigger condition after reconfiguring the logic analyzer control circuitry using the partial-reconfiguration controller circuitry.

18. A method of operating logic analyzer circuitry having partial-reconfiguration control circuitry, storage circuitry, and control circuitry, the method comprising:
  with the logic analyzer circuitry, receiving incoming data;
  with the storage circuitry, storing the incoming data;
  with the control circuitry, instructing the storage circuitry to stop storing the incoming data; and
  with the partial-reconfiguration control circuitry, performing partial reconfiguration operations on the control circuitry after the storage circuitry has stopped storing the incoming data.

19. The method defined in claim 18, wherein performing the partial reconfiguration operations on the control circuitry comprises:
  receiving a configuration bit stream from a logic design system; and
  reconfiguring the control circuitry using the configuration bit stream without reconfiguring other portions of the logic analyzer circuitry.

20. The method defined in claim 19, further comprising:
  with the logic analyzer circuitry, receiving additional incoming data;
  with the control circuitry, determining whether the additional incoming data satisfies a trigger condition; and
  with the control circuitry, instructing the storage circuitry to stop storing the incoming data in response to determining that the additional incoming data satisfies the trigger condition.

21. The method defined in claim 20, further comprising:
  with the control circuitry, filtering the incoming data by comparing the incoming data to a filter condition, wherein storing the incoming data comprises storing the filtered incoming data.

22. The method defined in claim 21, wherein reconfiguring the control circuitry comprises:
  adjusting the filter condition using the configuration bit stream.

23. The method defined in claim 22, wherein reconfiguring the control circuitry further comprises:
  adjusting the trigger condition using the configuration bit stream.

24. The method defined in claim 20, further comprising:
  with the control circuitry, instructing the storage circuitry to convey the stored incoming data to fault detection circuitry in response to determining that the additional incoming data satisfies the trigger condition.

* * * * *